United States Patent
Park et al.

(10) Patent No.: US 9,159,411 B2
(45) Date of Patent: Oct. 13, 2015

(54) MULTI-LEVEL MEMORY APPARATUS AND DATA SENSING METHOD THEREOF

(71) Applicants: SK HYNIX INC., Icheon (KR); Korea Advanced Institute of Science and Technology, Daejeon (KR)

(72) Inventors: Chul Hyun Park, Seoul (KR); Seung Tak Ryu, Daejeon (KR); Ji Wook Kwon, Daejeon (KR); Dong Hwan Jin, Seoul (KR)

(73) Assignees: SK Hynix Inc., Icheon (KR); Korea Advanced Institute of Science and Technology, Daejeon (KR)

( * ) Notice: Subject to any disclaimer, the term of this patent is extended or adjusted under 35 U.S.C. 154(b) by 219 days.

(21) Appl. No.: 13/935,407

(22) Filed: Jul. 3, 2013

(65) Prior Publication Data
US 2014/0010023 A1    Jan. 9, 2014

(30) Foreign Application Priority Data

Jul. 6, 2012    (KR) .................. 10-2012-0073759
May 15, 2013   (KR) .................. 10-2013-0054719

(51) Int. Cl.
*G11C 7/00*       (2006.01)
*G11C 13/00*      (2006.01)
*G11C 11/56*      (2006.01)

(52) U.S. Cl.
CPC .......... *G11C 13/004* (2013.01); *G11C 11/5678* (2013.01); *G11C 13/0004* (2013.01); *G11C 2013/0042* (2013.01); *G11C 2013/0054* (2013.01); *G11C 2213/72* (2013.01)

(58) Field of Classification Search
CPC . G11C 16/3418; G11C 16/0483; G11C 16/10
USPC .................. 365/189.02, 189.07, 190.15, 163, 365/189.15
See application file for complete search history.

(56) References Cited

U.S. PATENT DOCUMENTS

| | | | |
|---|---|---|---|
| 6,496,051 B1 | 12/2002 | Hsu | |
| 7,391,638 B2 * | 6/2008 | Fasoli et al. | 365/105 |
| 7,535,783 B2 * | 5/2009 | DeBrosse et al. | 365/208 |
| 7,920,402 B2 * | 4/2011 | Katoh et al. | 365/100 |
| 2007/0025146 A1 | 2/2007 | Huang | |
| 2010/0165718 A1 | 7/2010 | Park | |
| 2012/0287730 A1 | 11/2012 | Kim | |

\* cited by examiner

*Primary Examiner* — Son Dinh

(57) ABSTRACT

A multi-level memory apparatus includes two or more current paths configured to pass currents having different levels, a memory cell selectively coupled to the two or more current paths, and a cell current copy unit configured to copy a cell current flowing through the memory cell.

38 Claims, 18 Drawing Sheets

Prior art

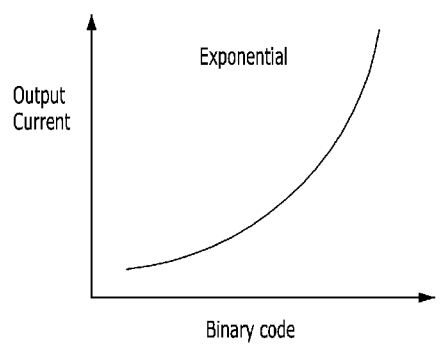

MULTI-LEVEL MEMORY APPARATUS AND DATA SENSING METHOD THEREOF

CROSS-REFERENCE TO RELATED APPLICATIONS

The present application claims priority of Korean Patent Application No. 10-2012-0073759, filed on Jul. 6$^{th}$, 2012, and No. 10-2013-0054719, May 15$^{th}$, 2013, which are incorporated herein by reference in its entirety.

BACKGROUND

1. Field

Embodiments of the present invention relate to a semiconductor apparatus, and more particularly, to a memory apparatus including multi-level memory cells.

2. Description of the Related Art

A conventional DRAM includes a memory cell implemented with a capacitor, and stores data by charging or discharging electric charges into or from the capacitor of the memory cell. However, data stored in a DRAM is volatile because a leakage current exists due to the characteristic of the capacitor. In order to avoid disadvantages resulting from the volatile characteristic of the DRAM, nonvolatile memories, which do not require data retention, have been developed. In particular, attempts to implement nonvolatility by changing a memory cell structure have been made. A representative example of the nonvolatile memories is a resistive memory apparatus, which includes resistive memory cells.

FIG. 1 schematically illustrates a conventional resistive memory apparatus. The conventional resistive memory apparatus includes a memory cell 10 and a transistor N1. The memory cell 10 is formed of a resistive material. A resistance value of the resistive material changes according to a temperature of the memory cell 10 or a current flowing through the memory cell 10. The memory cell 10 has a different resistance value depending on data stored therein.

The transistor N1 is coupled to the memory cell 10, and provides a sensing current to the memory cell 10 so as to sense the data stored in the memory cell 10. The transistor N1 applies a power supply voltage VPPSA to a sensing node SAI in response to a bias voltage VB.

The conventional resistive memory apparatus changes a voltage level of the sensing node SAI to sense the data stored in the memory cell 10. When the bias voltage VB is applied, the transistor N1 is turned on to provide a predetermined current to the sensing node SAI. The predetermined current provided to the sensing node SAI flows through the memory cell 10. Thus, the voltage level of the sensing node SAI changes depending on the resistance value of the memory cell 10. When the memory cell 10 has a large resistance value, the sensing node SAI has a high voltage level, and when the memory cell 10 has a small resistance value, the sensing node SAI has a low voltage level. As such, the conventional resistive memory apparatus provides the predetermined current to the sensing node SAI, and senses the data stored in the memory cell 10 based on the change in the voltage level of the sensing node SAI depending on the resistance value of the memory cell 10.

In order to reliably sense the change in the voltage level of the sensing node SAI depending on the resistance value of the memory cell 10, a boosting voltage VPPSA is used as the power supply voltage. A boosting voltage VPPSA having a higher level than an external voltage may be generated through a pumping circuit or the like.

SUMMARY

Embodiments are directed to a multi-level memory apparatus capable of detecting a wide range of currents flowing in a memory cell and a data sensing method thereof.

Embodiments are directed to a multi-level memory apparatus capable of detecting multi-level data stored in a memory cell without a separate boosting voltage circuit, and a data sensing method thereof.

In an embodiment, a multi-level memory apparatus includes: two or more current paths configured to pass different magnitudes of currents; a memory cell electrically and selectively connected to the two or more current paths; and a cell current copy unit configured to copy a cell current flowing through the memory cell.

The multi-level memory apparatus may include: a comparison unit configured to compare a copied cell current flowing through the cell current copy unit to a copied comparison current; a data output unit configured to convert and output a comparison signal outputted from the comparison unit; a comparison current output unit configured to output a comparison current using the comparison signal outputted from the data output unit; and a comparison current copy unit configured to copy the comparison current and output the copied comparison current.

In an embodiment, a multi-level memory apparatus includes: a cell current copy unit configured to copy a cell current flowing through a memory cell; a comparison unit configured to compare a copied cell current flowing through the cell current copy unit to a copied comparison current; a data output unit configured to convert and output a comparison signal outputted from the comparison unit; a comparison current output unit configured to output a comparison current using the comparison signal outputted from the data output unit; and a comparison current copy unit configured to copy the comparison current and output the coped comparison current.

In an embodiment, a data sensing method of a multi-level memory apparatus includes: selecting any one of two or more current paths passing different magnitudes of currents and passing a cell current to a memory cell connected to the selected current path; setting a comparison current for comparing the cell current to a predetermined value; copying the cell current into a current having the same magnitude when the cell current is larger than the predetermined value; and copying the cell current by amplifying the cell current by a predetermined number of multiples when the cell current is smaller than the predetermined value.

In an embodiment, a multi-level memory apparatus includes: two or more current paths configured to pass different magnitudes of currents; a memory cell electrically and selectively connected to the two or more currents paths; and a coarse detection unit configured to copy a cell current flowing through the memory cell and detect whether or not the magnitude of the cell current exceeds a predetermined reference value.

The multi-level memory apparatus may further include: a charge selection unit configured to select any one of the two or more current paths using an output of the coarse detection unit, and charge a charge unit disposed on the selected current path; a timing unit configured to output a state transition signal of which the state transits at each predetermined time interval, using a plurality of current sources having different sizes; a fine detection unit configured to trap the state transition signal outputted from the timing unit, using an output of the charge selection unit; and a cell current output unit configured to combine the output of the coarse detection unit and an output of the fine detection unit and digitally output the cell current.

In an embodiment, a multi-level memory apparatus includes: a plurality of A/D converters; and a timing unit configured to output a state transition signal of which the state transits at each predetermined time interval, using a plurality of current sources having different sizes. The A/D converters share an output of the timing unit.

Each of the A/D converters may include: two or more current paths configured to pass different magnitudes of currents; a coarse detection unit configured to copy a cell current flowing through a memory cell and detect whether or not the magnitude of the cell current exceeds a predetermined reference value; a charge selection unit configured to select any one of the two or more current paths using an output of the coarse detection unit, and charge a charging unit disposed on the selected current path; a fine detection unit configured to trap a state transition signal outputted from the timing unit using an output of the charge selection unit; and a cell current output unit configured to combine the output of the coarse detection unit and an output of the fine detection unit and digitally output the cell current.

BRIEF DESCRIPTION OF THE DRAWINGS

FIG. 6B is a graph illustrating an output current according to a binary code which changes exponentially.

DETAILED DESCRIPTION

Figure 1:
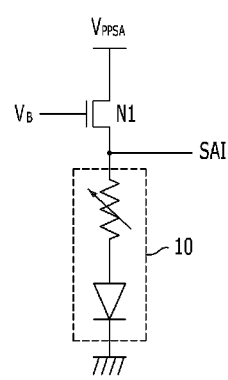
FIG. 1 schematically illustrates a conventional resistive memory apparatus.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

A multi-level resistive memory may have various resistance values depending on device characteristics. Thus, the multi-level resistive memory may store more than 2-bit data as well as binary data in one multi-level memory cell. In case of phase change RAM (PCRAM), a current ranging from 100 nA to 15 $\mu$A may flow in a memory cell. That is, a difference between the maximum current and the minimum current, which flow in the memory cell, is relatively large. Therefore, if the size of a switching element used to detect a current flowing in the memory cell is designed based on the minimum current, the maximum current may not pass through the switching element. If the size of the switching element is designed based on the maximum current, the switching element may be set in a weak inversion state while the minimum current passes through the switching element. When the switching element is set in the weak inversion state, the current passing through the switching element cannot be accurately copied.

According to embodiments of the present invention, a path for supplying a current to a memory cell may be diversified to accurately copy a current flowing in the memory cell.

Figure 2:
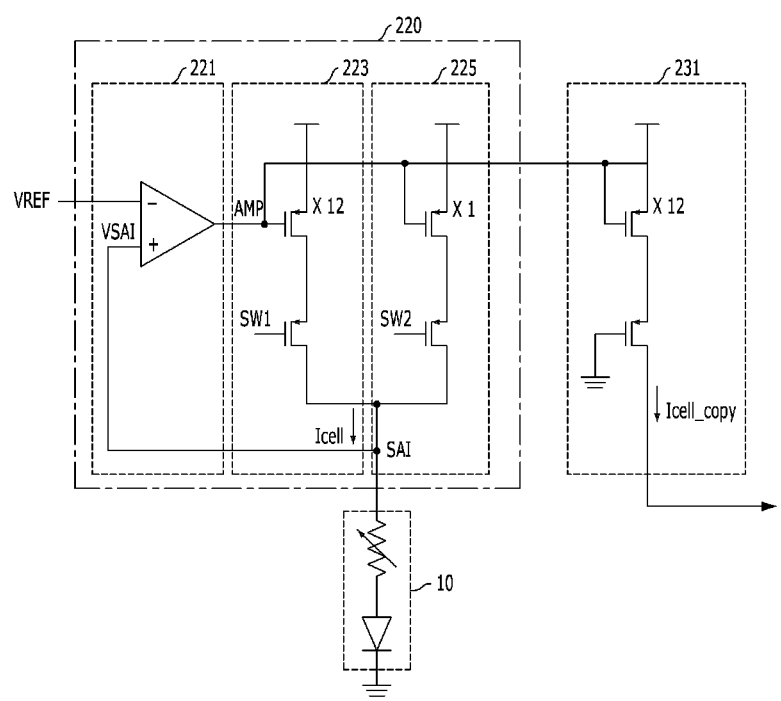
FIG. 2 illustrates a multi-level memory apparatus according to a first embodiment of the present invention.

FIG. 2 illustrates a multi-level memory apparatus according to a first embodiment of the present invention. The multi-level memory apparatus includes a memory cell 10, a detection voltage generation unit 220, and a cell current copy unit 231.

The detection voltage generation unit 220 is configured to amplify a difference between a reference voltage VREF and a sensing node voltage VSAI and provide a predetermined voltage to a sensing node SAI. The memory cell 10 is connected to the sensing node SAI, and an amount of current flowing in the sensing node SAI changes depending on a resistance value of the memory cell 10. That is, an amount of current flowing in the sensing node SAI when the memory cell 10 has a small resistance value is larger than an amount of current flowing in the sensing node SAI when the memory cell 10 has a large resistance value.

The multi-level memory apparatus according to the first embodiment of the present invention detects the current change at the sensing node SAI and has various advantages.

The conventional resistance memory apparatus shown in FIG. 1 changes a voltage level of the sensing node SAI according to the resistance value of the memory cell 10, and thus requires a threshold or reference value for sensing the voltage change at the sensing node SAI. In addition, the conventional resistance memory apparatus needs to provide a high-level voltage, e.g., the boosting voltage VPPSA, by pumping a power supply voltage as illustrated in FIG. 1.

Since the multi-level memory apparatus according to the first embodiment of the present invention senses the current change, the multi-level memory apparatus does not need to provide the high-level voltage to the memory cell 10. In addition, since the multi-level memory apparatus according to the embodiment of the present invention does not require a voltage threshold, the multi-level memory apparatus does not need to provide a wide range of voltages. For example, an external voltage VDD may be used as a power supply voltage as illustrated in FIG. 2. Thus, power consumption, which is generally increased due to the use of the boosting voltage, may be reduced, and a circuit for generating the high-level voltage may be unnecessary.

Furthermore, the time required for sensing data stored in the memory cell 10 is shortened since the multi-level memory apparatus detects the current change at the sensing node SAI. That is, the data sensing may be performed at higher speed. Moreover, an improved structure capable of providing a predetermined voltage to the sensing node SAI may be employed to remove an unnecessary element such as a clamping switch.

The detection voltage generation unit 220 includes a comparator 221 and a plurality of drivers 223 and 225. The comparator 221 is configured to amplify a difference between the reference voltage VREF and the sensing node voltage VSAI to generate an amplification signal AMP. The comparator 221 gradually decreases a voltage level of the amplification signal AMP until the sensing node voltage VSAI is equalized to the reference voltage VREF. The reference voltage VREF may have a level corresponding to a half of the level of the power supply voltage VDD.

The drivers 223 and 225 gradually drive the sensing node SAI to the level of the power supply voltage VDD in response to the amplification signal AMP. The drivers 223 and 225 increase the level of the sensing node voltage VSAI according to the decrease of the voltage level of the amplification signal AMP. When the reference voltage VREF and the sensing node voltage VSAI are equal to each other, the drivers 223 and 225 fix the level of the sensing node voltage VSAI. If the predetermined voltage is applied to the memory cell 10, a current flowing in the sensing node SAI changes depending on the resistance value of the memory cell 10.

When a large current flows through the memory cell 10 having a small resistance value, a first switch SW1 is turned on to operate a strong current driver 223, and when a small current flows through the memory cell 10 having a large resistance value, a second switch SW2 is turned on to operate a weak current driver 225. For example, when the current flowing through the memory cell 10 ranges from about 1.2 μA to 15 μA, the strong current driver 223 operates. When the current flowing through the memory cell 10 ranges from about 100 nA to 1.2 μA, the weak current driver 225 operates.

In an embodiment, the strong current driver 223 may have a driving ability sufficient to provide a current which is several to dozens of times higher than a current provided by the weak current driver 225. According to an embodiment of the present invention, the weak current driver 225 may include one switching element (for example, an FET), and the strong current driver 223 may include 12 switching elements having the same size and connected in parallel, the switching elements being controlled by the amplification signal AMP. According to another embodiment of the present invention, each of the weak current driver 225 and the strong current driver 223 may be implemented with one switching element, and the switching element of the strong current driver 223 may have a driving ability that is 12 times higher than that of the weak current driver 225. The cell current copy unit 231 has the same size as the strong current driver 223, and is configured to copy a cell current Icell flowing into the memory cell 10 through the driver 223 or 225 and output the copied cell current Icell_copy.

Figure 3:
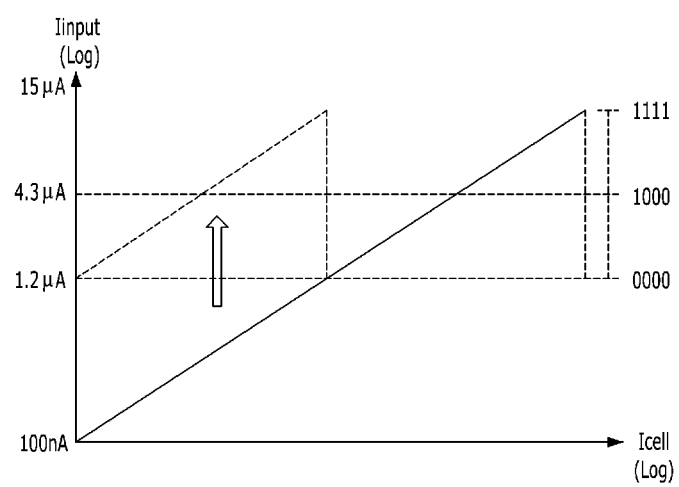
FIG. 3 is a graph showing an operation of the multi-level memory apparatus shown in FIG. 2.

FIG. 3 is a graph showing an operation of the multi-level memory apparatus shown in FIG. 2. When the current Icell flowing in the memory cell 10 ranges from 1.2 μA to 15 μA, the strong current driver 223 operates, and the copied cell current Icell_copy, ranging from 1.2 μA to 15 μA, is outputted from the cell current copy unit 231 serving as a current mirror. When the current Icell flowing in the memory cell 10 ranges from 100 nA to 1.2 μA, the weak current driver 225 operates. Since a switching element of the cell current copy unit 231 serving as a current mirror has a current amplification ability that is 12 times larger than that of the weak current driver 225, the switching element of the cell current copy unit 231 shifts a level of the copied cell current Icell_copy into the range of 1.2 μA to 15 μA. The amplification operation on a linear scale is identical to a level shift operation on a log scale.

Figure 4:
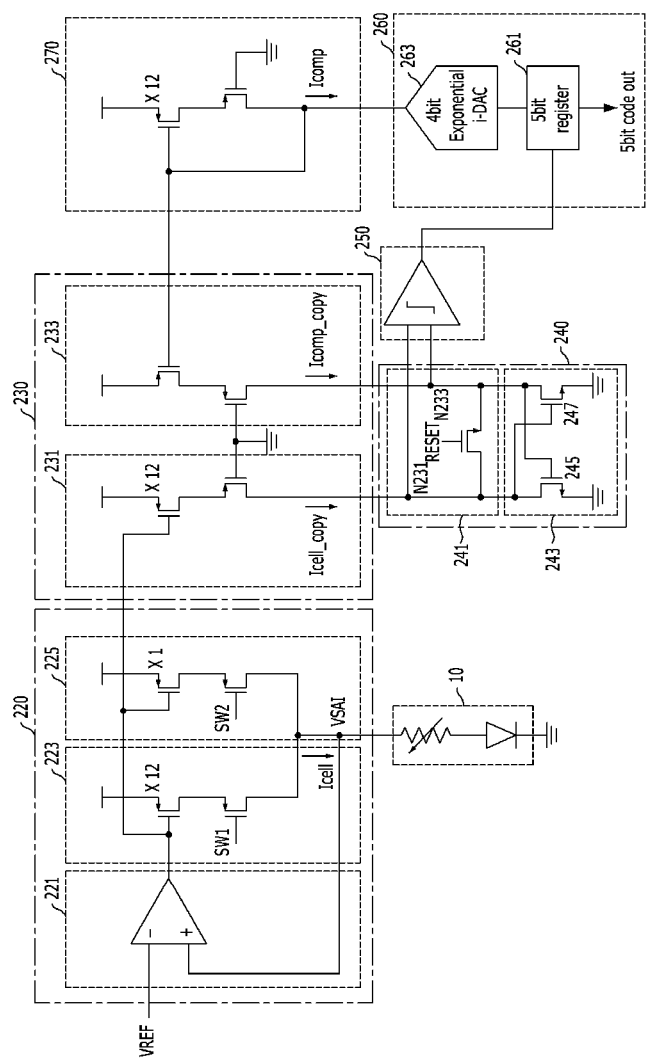
FIG. 4 illustrates a multi-level memory apparatus according to a second embodiment of the present invention.

FIG. 4 illustrates a multi-level memory apparatus according to a second embodiment of the present invention. The multi-level memory apparatus includes a memory cell 10, a detection voltage generation unit 220, a current copy unit 230, a first comparison unit 240, a second comparison unit 250, a data output unit 260, and a comparison current output unit 270.

The memory cell 10 and the detection voltage generation unit 220 have the same configuration as those of FIG. 2. The current copy unit 230 includes a cell current copy section 231 and a comparison current copy section 233. The cell current copy section 231 is configured to copy a cell current Icell flowing through the driver 223 or 225 and output the copied cell current Icell_copy, and the comparison current copy section 233 is configured to copy a comparison current Icomp flowing through the comparison current output unit 270 and output the copied comparison current Icomp_copy.

The first comparison unit 240 includes a reset section 241 and a positive feedback section 243. The reset section 241 is coupled to and disposed between a node N231, which is connected to the cell current copy section 231, and a node N233, which is connected to the comparison current copy section 233. The reset section 241 is configured to equalize potentials of the nodes N231 and N233 in response to a reset signal RESET. The positive feedback section 243 is configured to compare output voltages at both ends N231 and N233 of the current copy unit 230 according to a positive feedback method.

Specifically, if a switching element of the reset section 241 is turned on to equalize the potentials of the nodes N231 and N233, the nodes N231 and N233 are set at the same potential. When the reset section 241 is turned off, voltages of the nodes N231 and N233 are applied to switching elements 245 and 247 in the positive feedback unit 243. The switching element 245 is connected between the node N231 and a ground terminal, and controlled by the voltage of the node N233. The switching element 247 is connected between the node N233 and the ground terminal, and controlled by the voltage of the node N231.

The positive feedback section 243 is configured to compare the voltage of the node N231 with the voltage of the node N233 according to the positive feedback method. For example, if the copied cell current Icell_copy flowing from the node N231 to the ground terminal is greater than the copied comparison current Icomp_copy flowing from the node N233 to the ground terminal, the voltage VN231 of the node N231 has a lower level than that of the voltage VN233 of the node N233. At this point, since the voltage VN231 of the node N231 is applied as a control voltage of the switching element 247 disposed between the node N233 and the ground terminal, the switching element 247 approaches a turn-off state. At the same time, since the voltage VN233 of the node N233 is applied as a control voltage of the switching element 245 disposed between the node N231 and the ground terminal, the switching element 245 approaches a turn-on state. In this way, states of the switching elements 245 and 247 in the positive feedback section 243 are gradually widened in a positive direction.

The second comparison unit 250 is configured to compare the voltage VN231 of the node N231 with the voltage VN233 of the node N233 and output a comparison signal having a logic level "H" or "L".

The data output unit 260 includes a digital data output section 261 and a digital to analog (D/A) converter 263. The digital data output section 261 is configured to receive and temporarily store an output signal of the second comparison unit 250 and output a digital comparison signal. The D/A converter 263 is configured to convert the digital comparison signal outputted from the digital data output section 261 into an analog comparison signal.

According to an embodiment of the present invention, the digital data output section 261 is implemented with a 5-bit register, and the D/A converter 263 is implemented with a 4-bit D/A converter. That is, if the digital data output section 261 is implemented with an N-bit register, the D/A converter 263 is implemented with an (N−1)-bit D/A converter, N being a positive integer. The D/A converter 263 is configured to deal with a current change depending on data of the memory cell 10. According to an embodiment of the present invention, as a value of data stored in the memory cell 10 increases or decreases, the cell current Icell increases or decreases exponentially. In this case, an output signal, i.e., the analog comparison signal, of the D/A converter 263 also increases or decreases exponentially. According to another embodiment of the present invention, as the value of data stored in the memory cell 10 increases or decreases, the cell current Icell increases or decreases linearly. In this case, the output signal of the D/A converter 263 also increases or decreases linearly.

The comparison current output unit 270 includes switching elements having the same size and arranged in the same manner as the comparison current copy section 233, and is configured to output a comparison current Icomp that increases or decreases according to the output signal of the D/A converter 263.

Figure 5:
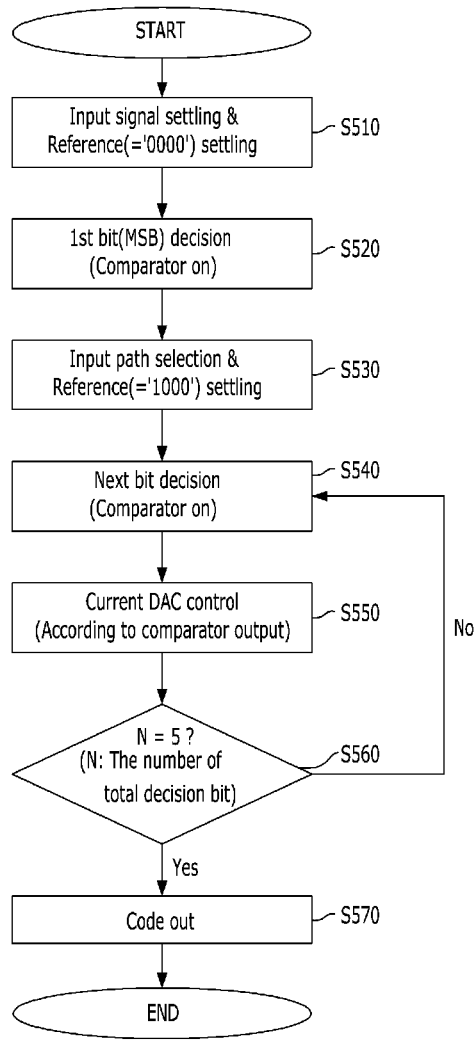
FIG. 5 is a flowchart showing an operation of the multi-level memory apparatus shown in FIG. 4.

FIG. 5 is a flowchart showing an operation of the multi-level memory apparatus shown in FIG. 4. The operation will be described with reference to FIGS. 4 and 5.

First, the second switch SW2 of the weak current driver 225 is turned on to provide the cell current Icell to the memory cell 10, and the cell current copy section 231 copies the cell current Icell flowing through the memory cell 10 and outputs the copied cell current Icell_copy to the node N231. Then, in response to the reset signal RESET, the switching element of the reset section 241 is turned on to equalize the voltages of the nodes N231 and N233, and thus the 5-bit register 261 outputs an output signal having "0000", at step S510.

After that, the switching element of the reset section 241 is turned off, and the D/A converter 263 receives "0000" from the 5-bit register 261 and outputs a comparison current Icomp of 1.2 μA. Then, the comparison current copy section 233 outputs a copied comparison current Icomp_copy of 1.2 μA, obtained by copying the comparison current Icomp, and the first and second comparison units 240 and 250 compare the copied cell current Icell_copy with the copied comparison current Icomp_copy of 1.2 μA, thereby setting a first bit (e.g., a most significant bit (MSB)) of the 5-bit register 261, at step S520.

If the copied cell current Icell_copy is larger than or equal to the copied comparison current Icomp_copy of 1.2 μA, the first switching element SW1 of the strong current driver 223 is turned on, and the 5-bit register 261 simultaneously outputs an output signal having "1000." As a result, a comparison current Icomp of 4.3 μA is outputted. If the copied cell current Icell_copy is smaller than the copied comparison current Icomp_copy, the second switching element SW2 of the weak current driver 225 is turned on to set the copied cell current Icell_copy in the range of 1.2 μA to 15 μA even if the cell current Icell ranges from 100 nA to 1.2 μA, at step S530. When the 5-bit register 261 outputs the output signal having "0000", the comparison current Icomp is maintained at 1.2 μA, but when the 5-bit register 261 outputs the output signal having "1000", the comparison current Icomp is changed to 4.3 μA. This process is based on a statistical method for finding a target value in the shortest time. Furthermore, 4.3 μA corresponds to an intermediate value between 1.2 μA and 15 μA in the log scale.

Then, the next bit of the output signal of the 5-bit register 261 is set at step S540. Thus, the output of the D/A converter 263 is controlled at step S550. When it is determined that the number of total set bits is equal to a bit number of the 5-bit register 261 at step S560, the 5-bit register 261 outputs a code value at step S570. When the number of total set bits is not equal to the bit number of the 5-bit register 261, the process returns to step S540.

Figure 6A:
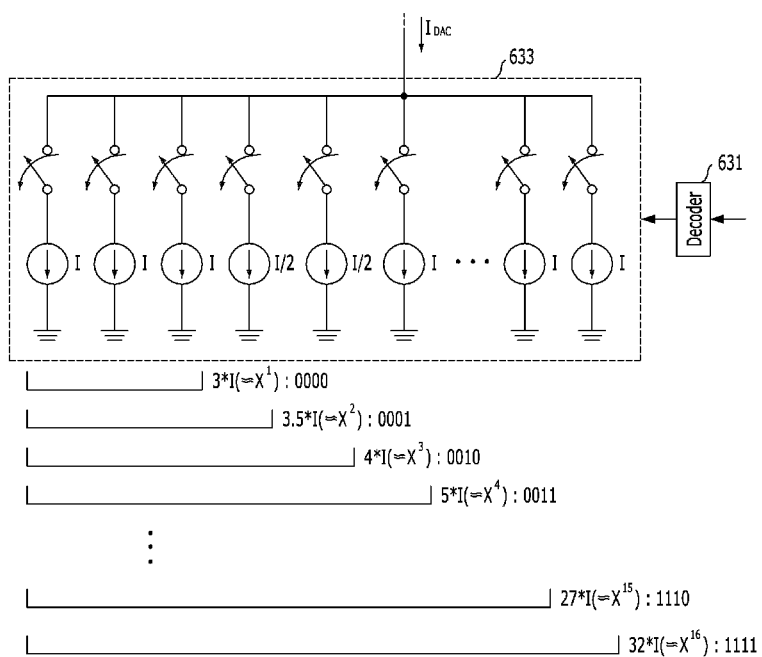
FIG. 6A illustrates a D/A converter of a multi-level memory apparatus according to a first embodiment of the present invention.

FIG. 6A illustrates a D/A converter of a multi-level memory apparatus according to a first embodiment of the present invention. FIG. 6B is a graph illustrating an output current of the D/A converter according to a binary code which exponentially changes.

If a cell current Icell of a resistive memory cell changes nonlinearly, e.g., exponentially, the D/A converter according to the first embodiment of the present invention changes a comparison current Icomp in the same manner, i.e., exponentially. The D/A converter includes a decoder 631 to decode the output signal of the 5-bit register 261 and a plurality of unit current cells 633 controlled according to an output of the decoder 631 and connected in parallel to each other. Each of the unit current cells 633 passes a current I or I/2.

For example, when the 5-bit register 261 outputs "0000", the unit current cells 633 are turned on to pass a current of 3*I. When the 5-bit register 261 outputs "0001", the unit current cells 633 are turned on to pass a current of 3.5*I. When the 5-bit register 261 outputs "1111", the unit current cells 633 are turned on to pass a current of 32*I. In this embodiment, a current $I_{DAC}$ means the comparison current Icomp which is equal to the copied comparison current Icomp_copy.

FIG. 6B shows that an output current, i.e., the comparison current Icomp, of the unit current cells 633 changes exponentially according to a bit value of the binary code output from the 5-bit register 261.

Figure 7A:
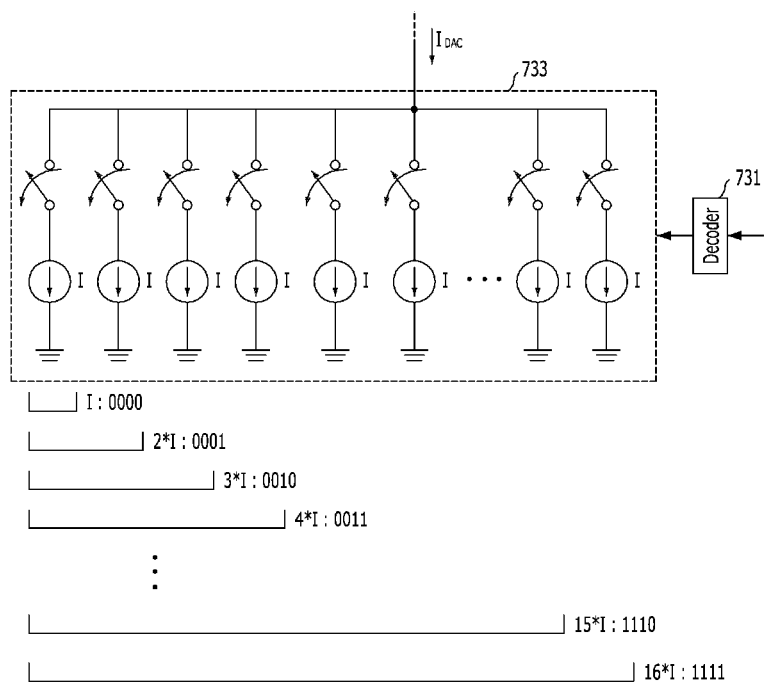
FIG. 7A illustrates a D/A converter of a multi-level memory apparatus according to a second embodiment of the present invention.
Figure 7B:
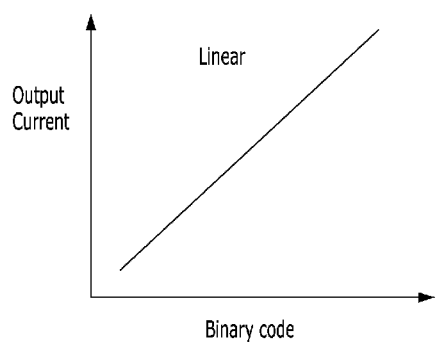
FIG. 7B is a graph illustrating an output current according to a binary code which changes linearly.

FIG. 7A illustrates a D/A converter according to a second embodiment of the present invention. FIG. 7B is a graph illustrating an output current of the D/A converter according to a binary code which changes linearly.

If a cell current Icell of a resistive memory cell changes linearly, the D/A converter of the multi-level memory apparatus according to the second embodiment of the present invention linearly changes a comparison current Icomp. The D/A converter includes a decoder 731 configured to decode the output signal of the 5-bit register 261 and a plurality of unit current cells 733 controlled according to an output of the decoder 731 and connected in parallel to each other. Each of the unit current cells 733 passes a current I.

For example, when the 5-bit register 261 outputs "0000", the unit current cells 733 are turned on to pass a current of I. When the 5-bit register 261 outputs "0001", the unit current cells 733 are turned on to pass a current of 2*I. When the 5-bit register 261 outputs "1111", the unit current cells 733 are turned on to pass a current of 16*I.

FIG. 7B shows that an output current, i.e., the comparison current Icomp, of the unit current cells 733 changes linearly according to a bit value of the binary code output from the 5-bit register 261.

Figure 8:
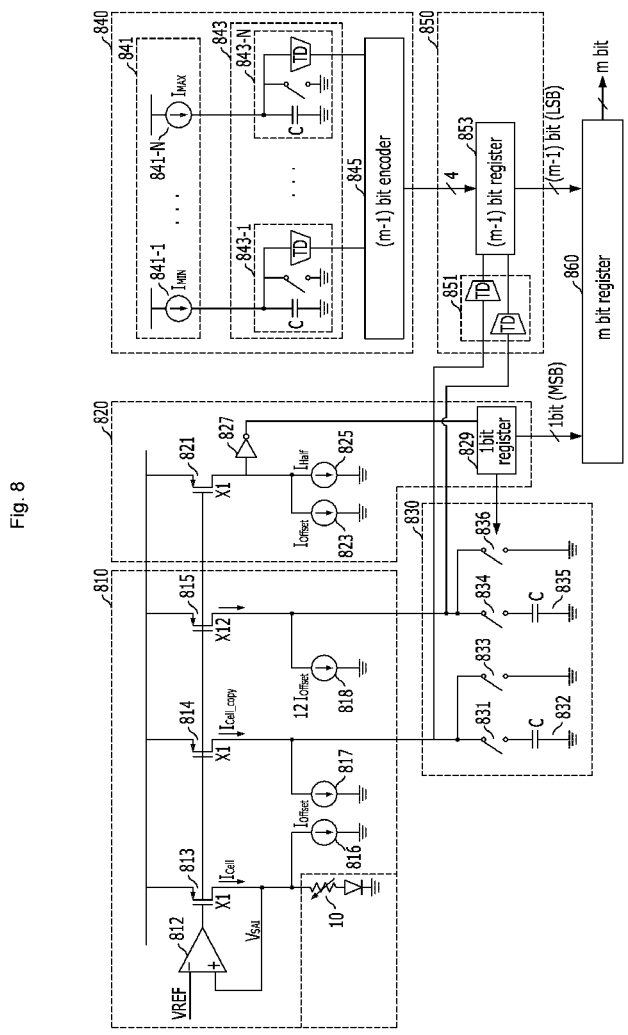
FIG. 8 illustrates a multi-level memory apparatus according to a third embodiment of the present invention.

FIG. 8 illustrates a multi-level memory apparatus according to a third embodiment of the present invention. The multi-level memory apparatus includes a memory cell 10, a detection voltage generation unit 810, a coarse detection unit 820, a charge selection unit 830, a timing unit 840, a fine detection unit 850, and a data output unit 860.

The detection voltage generation unit 810 includes a comparator 812, a cell current driver 813, a first cell current copy driver 814, and a second cell current copy driver 815.

The memory cell 10 is configured to receive a predetermined voltage and change a current flowing through a sensing node VSAI according to a resistance value thereof. A first offset current source (Ioffset) 816 serves to pass an offset current (for example, 1 μA) and increase a lower limit of a current passing through the cell current driver 813 because a difference between an upper limit and the lower limit of the current passing through the cell current driver 813 is limited. A second offset current source 817 and a third offset current source 818 perform the same function as that of the first offset current source 816 on the first cell current copy driver 814 and the second cell current copy driver 815, respectively.

When a large current flows through the memory cell 10 because the memory cell 10 has a small resistance value, the first cell current copy driver 814 operates, and when a small current flows through the memory cell 805 because the memory cell 805 has a large resistance value, the second cell current copy driver 815 operates. For example, when a current flowing through the memory cell 10 ranges from 1.2 μA to 15 μA, the first cell current copy driver 814 operates, and when the current flowing through the memory cell 10 ranges from 100 nA to 1.2 μA, the second cell current copy driver 815 operates.

According to an embodiment of the present invention, the first cell current copy driver 814 includes one switching element (for example, an FET), and the second cell current copy driver 815 includes 12 switching elements having the same size as that of the switching element of the first cell current copy driver 814 and connected in parallel to each other.

According to another embodiment of the present invention, each of the first and second cell current copy drivers 814 and 815 is implemented with one switching element, and the switching element of the second cell current copy driver 815 outputs a current 12 times higher than a current flowing through the switching element of the first cell current copy driver 814.

The coarse detection unit 820 includes a third cell current copy driver 821, a fourth offset current source 823, a reference current source 825, an inverter 827, and a coarse detection value management section 829. The coarse detection unit 820 copies the cell current Icell and coarsely determines a level of the cell current Icell.

The third cell current copy driver 821 copies the cell current Icell.

The third offset current source 823 passes an offset current and reduces a difference between an upper limit and a lower limit of a current flowing through the third cell current copy driver 821.

The reference current source 825 is connected in parallel to the third offset current source 823. The reference current source 825 is disposed between the third cell current copy driver 821 and a ground terminal, and passes a reference current Ihalf to the ground terminal.

The inverter 827 is coupled to a node coupled to and disposed between the third cell current copy driver 821 and the reference current source 825. The inverter 827 outputs a first logic level signal L when the current flowing through the third cell current copy driver 821 is larger than or equal to the reference current Ihalf, and outputs a second logic level signal H when the current flowing through the third cell current copy driver 821 is smaller than the reference current Ihalf.

The coarse detection value management section 829 is configured to temporarily store and output the output signal of the inverter 827 to the charge selection unit 830, and may include a one-bit register. For example, if the inverter 827 outputs the first logic level signal L, a first switch 831 in the charge selection unit 830 is turned on to charge a first capacitor 832, and if the inverter 827 outputs the second logic level signal H, a second switch 834 in the charge selection unit 830 is turned on to charge a second capacitor 835.

When the cell current Icell is greater than the reference current Ihalf because the memory cell 10 has a small resistance value, the coarse detection unit 820 outputs the first logic level signal L, and when the cell current Icell is smaller than the reference current Ihalf because the memory cell 805 has a large resistance value, the coarse detection unit 820 outputs the second logic level signal H. The reference current Ihalf indicates a half value of the cell current Icell when the cell current Icell is defined on the log scale. For example, the reference current Ihalf is set to 1.2 μA.

The charge selection unit 830 includes the first capacitor 832, the first charge switch 831, the second capacitor 835, the second charge switch 834, a first discharge switch 833, and a second discharge switch 836. The first capacitor 832 is disposed between the first cell current copy driver 814 and the ground terminal and coupled to the first cell current copy driver 814 through the first charge switch 831. The first charge switch 831 controls charging of the first capacitor 832. The second capacitor 835 is disposed between the second cell current copy driver 815 and the ground terminal and coupled to the second cell current copy driver 815 through the second charge switch 834. The second charge switch 834 controls charging of the second capacitor 835. The first discharge switch 833 is connected in parallel to the first capacitor 832 and the first charge switch 831. The second discharge switch 836 is connected in parallel to the second capacitor 835 and the second charge switch 834.

When the cell current Icell flowing through the memory cell 10 is smaller than the reference current Ihalf, the charge selection unit 830 selects a current path on which the second cell current copy driver 815 for amplifying the copied cell current Icell_copy is disposed. When the cell current Icell flowing through the memory cell 10 is greater than the reference current Ihalf, the charge selection unit 830 selects a current path on which the first cell current copy driver 814 is disposed and through which a current corresponding to the coped cell current Icell_copy flows.

Specifically, when the coarse detection value management section 829 outputs the first logic level signal L, the first charge switch 831 of the charge selection unit 830 is turned on to charge the first capacitor 832 on the current path including the first cell current copy driver 814. When the coarse detection value management section 829 outputs the second logic level signal H, the second charge switch 834 of the charge selection unit 830 is turned on to charge the second capacitor 835 on the current path including the second cell current copy driver 815.

As a different current path is selected according to the level of the cell current Icell, the cell current Icell is shifted upward by the reference current Ihalf in the range of 100 nA to 1.2 μA where the cell current Icell is smaller than the reference current value Ihalf as illustrated in FIG. 3. The first discharge switch 833 discharges electric charges stored in the first capacitor 832 before the current path is selected, and the second discharge switch 836 discharges electric charges stored in the second capacitor 835 before the current path is selected.

The timing unit 840 includes a current supply section 841, a charge time detection section 843, and an encoder 845.

The current supply section 841 includes a plurality of current sources 841-1, ..., 841-N (N is a positive integer) independently and simultaneously supplying currents having two or more different levels.

The charge time detection section 843 is configured to convert the different currents, outputted from the plurality of current sources 841-1, ..., 841-N, into different times. Specifically, the charge time detection section 843 independently stores the currents outputted from the plurality of current sources 841-1, ..., 841-N in capacitors having the same capacity, respectively, and changes a logic state of an output signal when voltages of the capacitors reach a predetermined level.

For example, the voltage of a capacitor 843-N (C) charged by the current source 841-N capable of outputting the largest current reaches a threshold voltage Vth for the first time, and a threshold detector 843-N (TD) changes a logic state of a threshold voltage detection signal from a logic high H to a logic low L. The voltage of a capacitor 843-1 (C) charged by the current source 841-1 capable of outputting the smallest current reaches the threshold voltage Vth for the last time, and a threshold detector 843-1 (TD) changes the logic state of the threshold voltage detection signal from the logic high H to a logic low L. That is, the charge time detection section 843 sequentially outputs "11 ... 11", "11 ... 10", "11 ... 00", ..., "10 ... 00", and "00 ... 00" at a predetermined time interval.

The encoder 845 is configured to encode an output of the charge time detection section 843 and output a code value. For example, the encoder 845 encodes a 16-bit input into a 4-bit output.

The fine detection unit 850 includes a cell current level detection section 851 and a fine detection value management section 853.

The cell current level detection section 851 is configured to change a logic state of a cell current level detection signal from a logic high H to a logic low L when the voltage stored in the first capacitor 832 or the second capacitor 834 in the charge selection unit 830 reaches the threshold voltage Vth.

The fine detection value management section 853 is controlled in response to the cell current level detection signal changed to the logic low L. The fine detection value management section 853 stores and outputs the code value outputted from the encoder 845 when the cell current level detection signal is changed to the logic low L. The fine detection value management section 853 may be implemented with a 4-bit register.

The data output unit 860 is configured to output a bit value corresponding to the level of the cell current flowing through the memory cell 805 based on an output of the coarse detection value management section 829 and an output of the fine detection value management section 853. The data output unit 860 may be implemented with a 5-bit register.

Figure 9A:
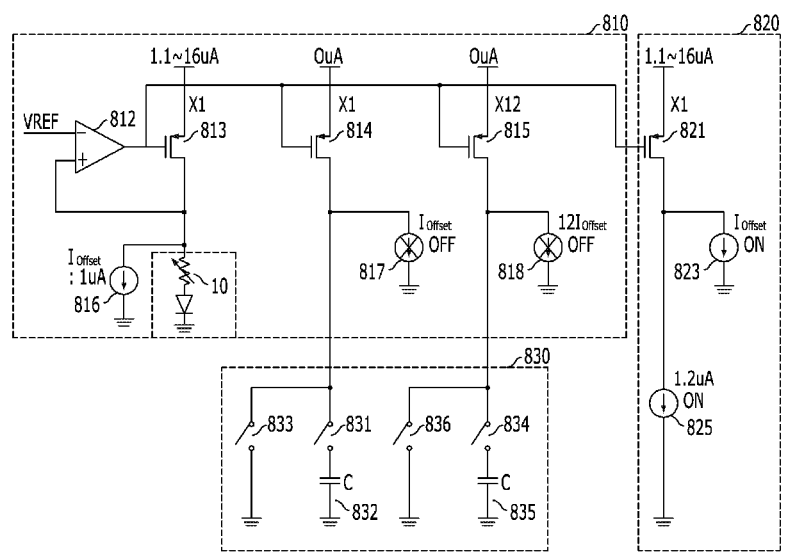
FIGS. 9A to 9C illustrate an operation of the multi-level memory apparatus shown in FIG. 8.
Figure 9B:
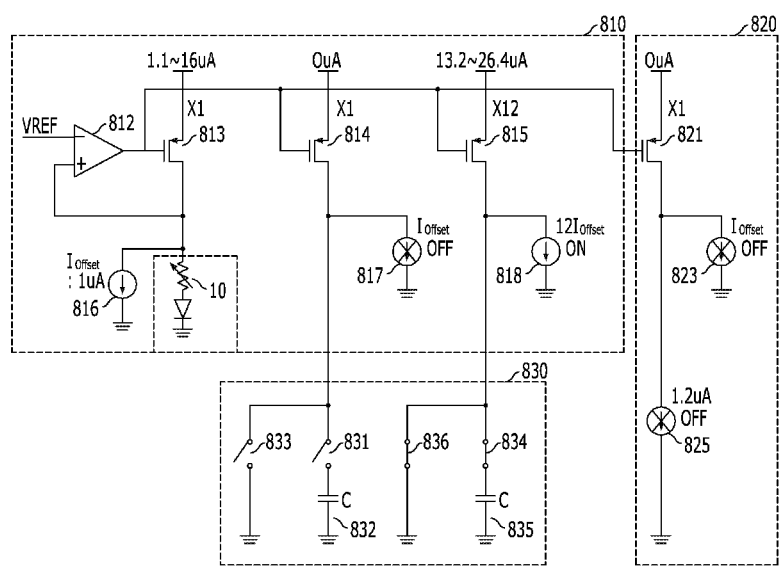
Figure 9C:
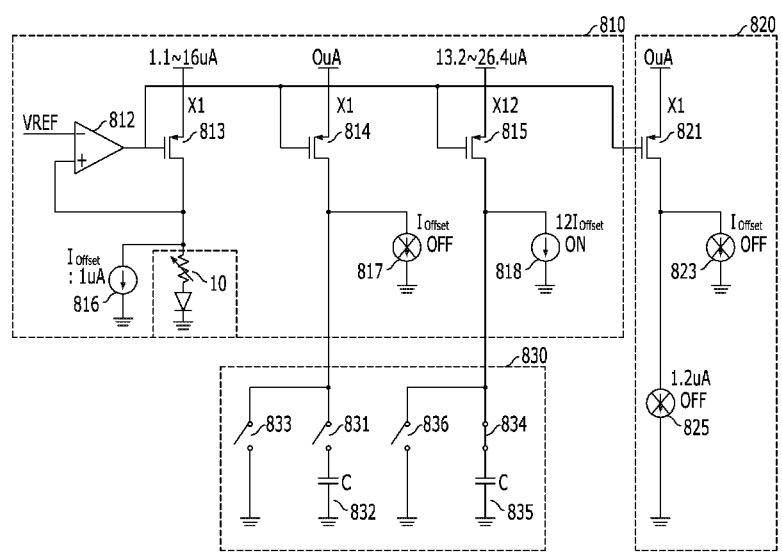

FIGS. 9A to 9C illustrate an operation of the multi-level memory apparatus shown in FIG. 8. FIG. 9A shows a coarse determination of a level of the cell current Icell, FIG. 9B shows resetting the capacitor that is to be charged with the copied cell current Icell_copy, and FIG. 9C shows charging the capacitor with the copied cell current Icell_copy.

First, referring to FIG. 9A, the second and third offset current sources 817 and 818 within the detection voltage generation unit 810 are turned off, all of the switches 831, 833, 834, and 836 within the charge selection unit 830 are opened, and the fourth offset current source 823 and the reference current source 825 within the coarse detection unit 820 are turned on. In this state, the copied cell current Icell_copy passes through the third cell current copy driver 821 of the coarse detection unit 820, and the cell current Icell and the reference current Ihalf are compared to coarsely determine a level of the cell current Icell.

Referring to FIG. 9B, when the cell current Icell is larger than the reference current Ihalf, the second offset current source 817 of the detection voltage generation unit 810 maintains the turn-off state, the third offset current source 818 is turned on, the first charge switch 831 and the first discharge switch 833 within the charge selection unit 830 maintain the open state, the second charge switch 834 and the second discharge switch 836 are closed, and the fourth offset current source 823 and the reference current source 825 within the coarse detection unit 820 are turned off, thereby resetting the second capacitor 835 that is to be charged with the copied cell current Icell_copy.

Finally, referring to FIG. 9C, the second discharge switch 836 of the charge selection unit 830 is opened to charge the second capacitor 835 with the copied cell current Icell_copy.

FIGS. 10A to 10D illustrate a circuit diagram and an operation of the threshold detector TD of the multi-level memory apparatus shown in FIG. 8.

The threshold detector TD includes a threshold detection capacitor $C_{TD}$, a reset switch 1011, a pre-set switch 1013, and an output switch 1015. The reset switch 1011 is connected in parallel to the threshold detection capacitor $C_{TD}$ and configured to reset the threshold detection capacitor $C_{TD}$. The pre-set switch 1013 is disposed between a power line and an output node and configured to precharge the output node with a power supply voltage VDD in response to a pre-set signal. The output switch 1015 is disposed between the output node and the ground terminal and configured to discharge the output node according to the threshold voltage Vth applied to the threshold detection capacitor $C_{TD}$. Since a configuration of an element that provides control signals for controlling the reset switch 1011, the pre-set switch 1013, and the output switch 1015 may be easily implemented by those skilled in the art, detailed descriptions thereof are omitted herein.

The operation of the threshold detector TD of the multi-level memory apparatus shown in FIG. 8 will be described hereinafter with reference to FIGS. 10A to 10D.

Figure 10A:
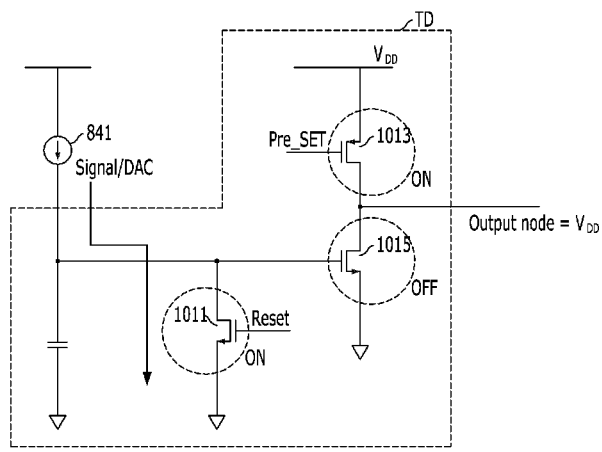
FIGS. 10A to 10D illustrate a circuit diagram and an operation of a threshold detector of the multi-level memory apparatus shown in FIG. 8.

First, referring to FIG. 10A, the reset switch 1011 and the pre-set switch 1013 are turned on, and the output switch 1015 is turned off, thereby discharging or resetting the threshold detection capacitor $C_{TD}$ and precharging the output node with the power supply voltage VDD.

Figure 10B:
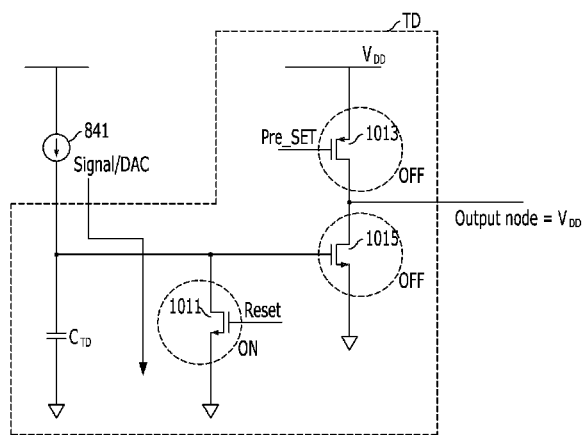

Then, referring to FIG. 10B, the pre-set switch 1013 is turned off to terminate the precharging of the output node.

Figure 10C:
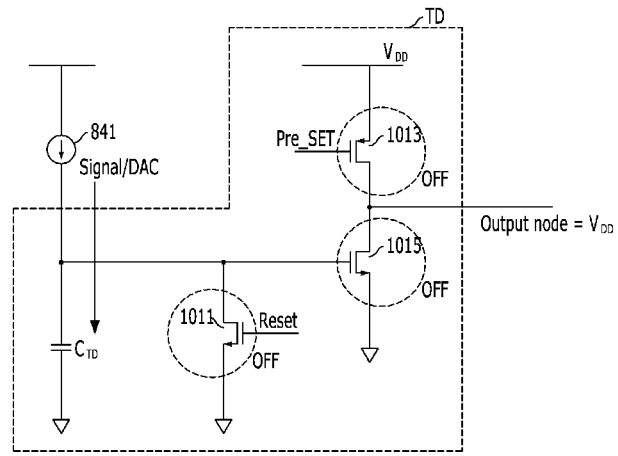

Then, referring to FIG. 10C, the reset switch 1011 is turned off to charge the threshold detection capacitor $C_{TD}$.

Figure 10D:
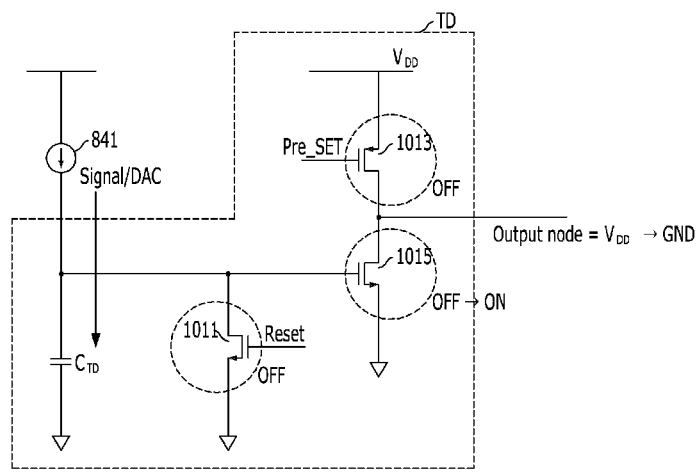

Finally, referring to FIG. 10D, when the voltage stored in the threshold detection capacitor $C_{TD}$ reaches the threshold voltage Vth, the output switch 1015 is switched to discharge the output node, such that a voltage of the output node changes to a ground voltage.

Figure 11:
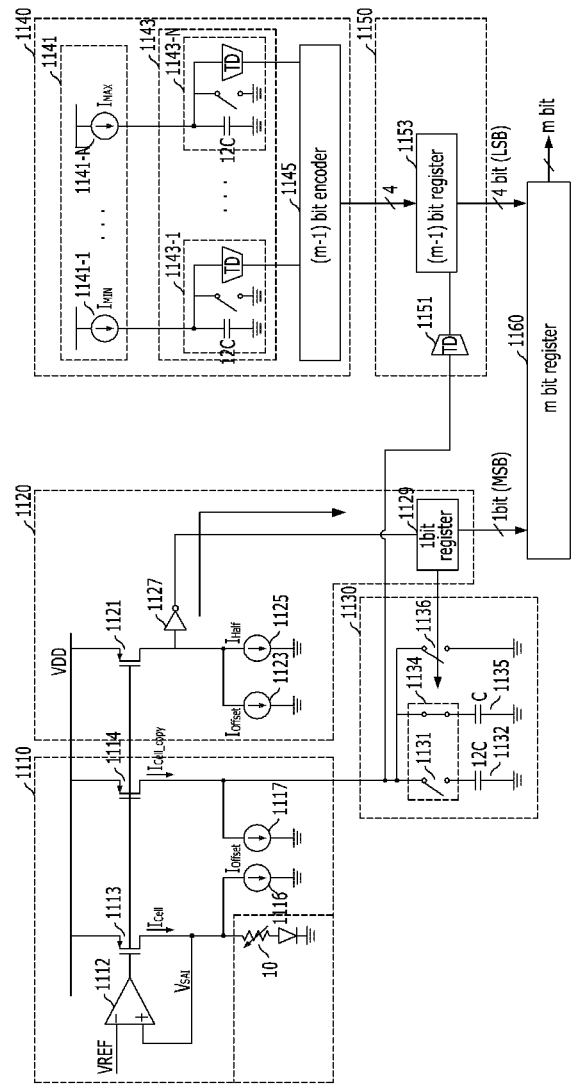
FIG. 11 illustrates a multi-level memory apparatus according to a fourth embodiment of the present invention.

FIG. 11 illustrates a multi-level memory apparatus according to a fourth embodiment of the present invention. The multi-level memory apparatus includes a detection voltage generation unit 1110, a coarse detection unit 1120, a charge selection unit 1130, a timing unit 1140, a fine detection unit 1150, and a cell current output unit 1160.

In the multi-level memory apparatus of FIG. 8, the cell current copy drivers having different sizes charge the capacitors having the same capacity. However, in the multi-level memory apparatus of FIG. 11, one cell current copy driver 1114 selectively charges capacitors having different sizes with a copied cell current Icell_copy in response to an output of a 1-bit register 1129 in the coarse detection unit 1120.

That is, when a cell current Icell flowing through a memory cell 10 is smaller than a reference current Ihalf because the memory cell 10 has a large resistance value, the charge selection unit 1130 selects a current path on which a small-capacity capacitor 1135 is disposed, such that the small-capacity capacitor 1135 is charged with the copied cell current Icell_copy. When the cell current Icell flowing through the memory cell 10 is larger than the reference current Ihalf because the memory cell 10 has a small resistance value, the charge selection unit 1130 selects a current path on which a large-capacity capacitor 1132 is disposed, such that the large-capacity capacitor 1132 is charged with the copied cell current Icell_copy.

Since configurations and operations of the other components of FIG. 11 are similar to or the same as those of FIG. 8, detailed descriptions thereof are omitted herein.

Figure 12:
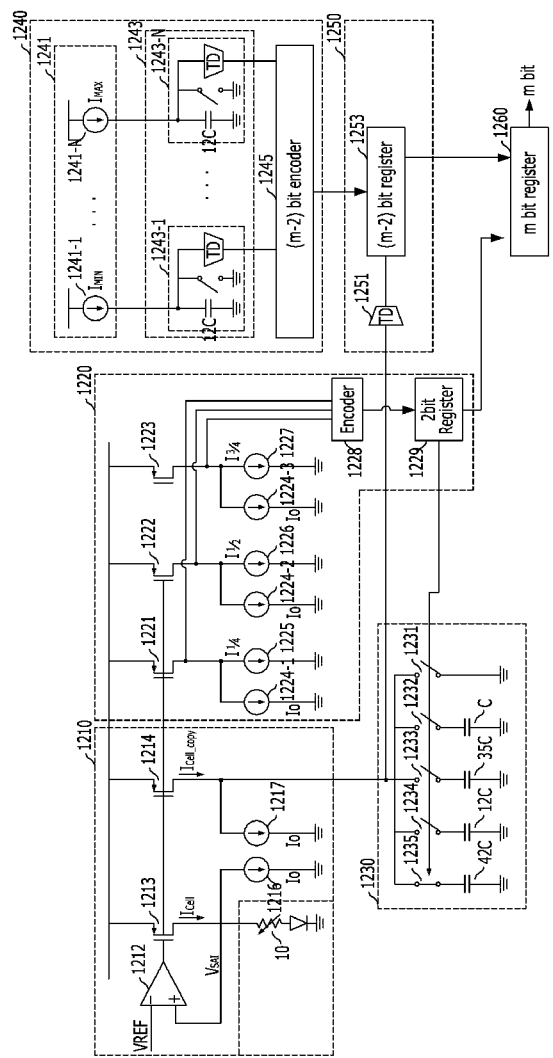
FIG. 12 illustrates a multi-level memory apparatus according to a fifth embodiment of the present invention.

FIG. 12 illustrates a multi-level memory apparatus according to a fifth embodiment of the present invention. The multi-level memory apparatus includes a detection voltage generation unit 1210, a coarse detection unit 1220, a charge selection unit 1230, a timing unit 1240, a fine detection unit 1250, and a cell current output unit 1260.

In the multi-level memory apparatus of FIG. 11, the coarse detection unit 1120 outputs a one-bit upper detection value, and the fine detection unit 1150 outputs a four-bit lower detection value. However, in the multi-level memory apparatus of FIG. 12, the coarse detection unit 1220 outputs a two-bit upper detection value, and the fine detection unit 1250 outputs a three-bit lower detection value.

The coarse detection unit 1220 includes second to fourth cell current copy drivers 1221, 1222, and 1223, first to third reference current sources 1225, 1226, and 1227, and an encoder 1228. The second to fourth cell current copy drivers 1221, 1222, and 1223 form a current mirror. The first to third reference current sources 1225, 1226, and 1227 are coupled to and disposed between the second to fourth cell current copy drivers 1221, 1222, and 1223, respectively, and the ground terminal. Each of the first to third reference current sources 1225, 1226, and 1227 forms a pair with a corresponding one of offset current sources 1224-1, 1224-2, and 1224-3. The encoder 1228 is configured to receive outputs of the second to fourth cell current copy drivers 1221, 1222, and 1223 in parallel and output an encoded two-bit coarse detection signal.

The first to third reference current sources 1225, 1226, and 1227 may provide different reference currents. For example, the first to third reference current sources 1225, 1226, and 1227 pass currents corresponding to $1/4$, $1/2$, and $3/4$ of the maximum cell current Imax, respectively.

The currents corresponding to $1/4$, $1/2$, and $3/4$ of the maximum cell current Imax may be obtained by converting currents according to the log scale. For example, when the cell current ranges from $1/4*$Imax to $1/2*$Imax, the encoder 1228 receives "001" and outputs "01", and a two-bit register 1229 turns on a second charge switch 1233 in the charge selection unit 1230 to charge a second capacitor 35C. The charge selection unit 1230 includes four capacitors having different capacitance values C, 35C, 12C, and 42C, respectively, which are selectively charged in response to a bit value of the output of the two-bit register 1229.

Figure 13:
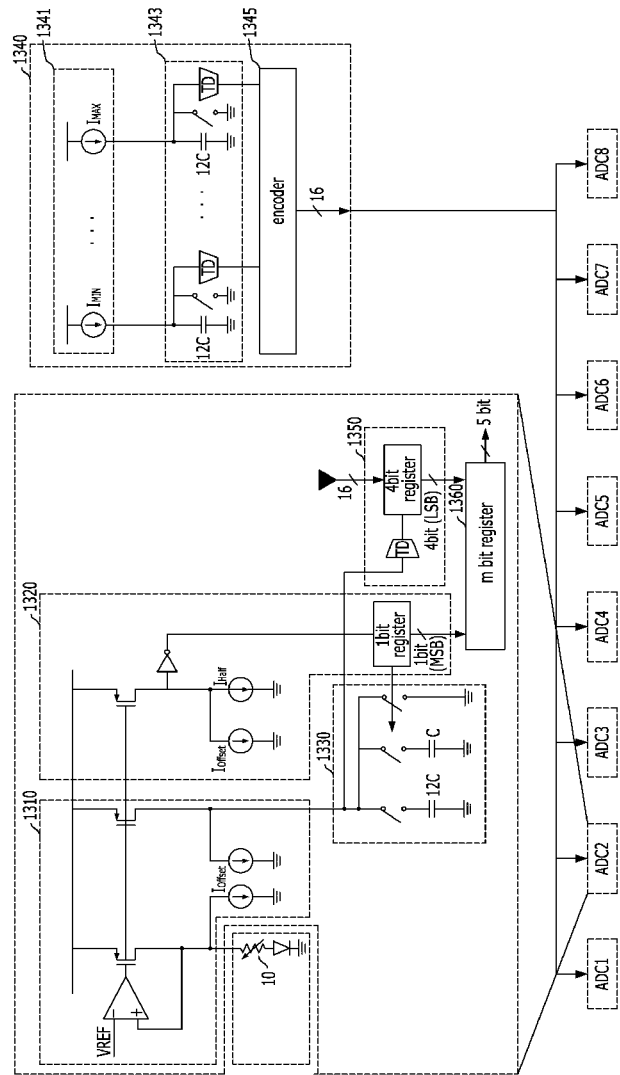
FIG. 13 illustrates a multi-level memory apparatus according to a sixth embodiment of the present invention.

FIG. 13 illustrates a multi-level memory apparatus according to a sixth embodiment of the present invention. The multi-level memory apparatus includes a plurality of A/D converters, e.g., ADC1 to ADC8, sharing a timing unit 1340.

The multi-level memory apparatus includes the plurality of A/D converters ADC1 to ADC8 to rapidly read data stored in memory cells. Each of the A/D converters ADC1 to ADC8 includes a detection voltage generation unit 1310, a coarse detection unit 1320, a charge selection unit 1330, a fine detection unit 1350, and a cell current output unit 1360. The plurality of A/D converters ADC1 to ADC8 share an output of the timing unit 1340 if each of the A/D converters ADC1 to ADC8 operates coincidentally using an external clock.

According to the embodiments of the present invention, since the multi-level memory apparatus accurately detects a wide range of currents depending on a change in a resistance value of a memory cell, it is possible to maximize an amount of data stored in the memory cell. Furthermore, the multi-level memory apparatus according to an embodiment does not need a high power supply voltage.

Although various embodiments have been described for illustrative purposes, it will be apparent to those skilled in the art that various changes and modifications may be made without departing from the spirit and scope of the invention as defined in the following claims.

What is claimed is:

1. A multi-level memory apparatus comprising:
   two or more current paths configured to pass currents having different levels;
   a memory cell selectively coupled to the two or more current paths;
   a cell current copy unit configured to copy a cell current flowing through the memory cell and output a copied cell current;
   a comparison unit configured to compare the copied cell current flowing through the cell current copy unit with a copied comparison current;
   a data output unit configured to convert an output signal of the comparison unit and output a comparison signal;
   a comparison current output unit configured to output a comparison current using the comparison signal outputted from the data output unit; and
   a comparison current copy unit configured to copy the comparison current and output the copied comparison current.

2. The multi-level memory apparatus of claim 1, wherein the cell current copy unit is coupled to the two or more current paths in the form of a current mirror.

3. The multi-level memory apparatus of claim 1, wherein the two or more current paths comprise:
   a first current driver configured to pass the cell current in a first range; and
   a second current driver configured to pass the cell current in a second range that is different from the first range.

4. The multi-level memory apparatus of claim 3, wherein the cell current copy unit passes a current having substantially the same level as that of a current passing the first current driver.

5. The multi-level memory apparatus of claim 1, wherein the comparison unit comprises:
   a first comparison unit configured to amplify a voltage difference between a first node on a path through which the copied cell current flows and a second node on a path through which the copied comparison current flows, using the copied cell current and the copied comparison current; and a second comparison unit configured to compare output signals of the first and second nodes.

6. The multi-level memory apparatus of claim 5, wherein the first comparison unit comprises:
a reset section coupled to and disposed between the first and second nodes and configured to equalize voltages of the first and second node in response to a reset signal; and
a positive feedback section configured to amplify the voltage difference between the first and second nodes using a positive feedback method.

7. The multi-level memory apparatus of claim 6, wherein the positive feedback section comprises:
a first switching element coupled to and disposed between the first node and a ground terminal and controlled by the voltage of the second node; and
a second switching element coupled to and disposed between the second node and the ground terminal and controlled by the voltage of the first node.

8. The multi-level memory apparatus of claim 1, wherein the data output unit comprises:
a storage section configured to temporarily store the output signal of the comparison unit; and
a conversion section configured to convert a digital comparison signal outputted from the storage section into an analog comparison signal.

9. The multi-level memory apparatus of claim 8, wherein the storage section comprises an N-bit register, N being a positive integer.

10. The multi-level memory apparatus of claim 9, wherein the conversion section comprises an (N−1)-bit digital/analog converter.

11. The multi-level memory apparatus of claim 10, wherein the conversion section is configured to determine a level of the comparison current based on a change of the cell current, the change of the cell current depending on a value of data of the memory cell.

12. The multi-level memory apparatus of claim 10, wherein the conversion section is configured to provide an output that exponentially decreases and increases.

13. The multi-level memory apparatus of claim 10, wherein the conversion section is configured to provide an output that linearly decreases and increases.

14. The multi-level memory apparatus of claim 10, wherein the conversion section comprises:
a decoder configured to decode the digital comparison signal output from the storage section; and
a plurality of unit current cells controlled by an output of the decoder and connected in parallel to each other, the plurality of unit current cells being configured to output the analog comparison signal as the comparison signal.

15. A multi-level memory apparatus comprises:
a cell current copy unit configured to copy a cell current flowing through a memory cell and output a copied cell current;
a comparison unit configured to compare the copied cell current with a copied comparison current;
a data output unit configured to convert an output signal of the comparison unit and output a comparison signal;
a comparison current output unit configured to output a comparison current using the comparison signal outputted from the data output unit; and a comparison current copy unit configured to copy the comparison current and output the copied comparison current.

16. The multi-level memory apparatus of claim 15, wherein the comparison unit comprises:
a first comparison unit configured to amplify a voltage difference between a first node on a path through which the copied cell current flows and a second node on a path through which the copied comparison current flows, using the copied cell current and the copied comparison current; and
a second comparison unit configured to compare output signals of the first and second nodes.

17. The multi-level memory apparatus of claim 16, wherein the first comparison unit comprises:
a reset section coupled to and disposed between the first and second nodes and configured to equalize voltages of the first and second node in response to a reset signal; and
a positive feedback section configured to amplify the voltage difference between the first and second nodes using a positive feedback method.

18. The multi-level memory apparatus of claim 17, wherein the positive feedback section comprises:
a first switching element coupled to and disposed between the first node and a ground terminal and controlled by the voltage of the second node; and
a second switching element coupled to and disposed between the second node an the ground terminal and controlled by the voltage of the first node.

19. The multi-level memory apparatus of claim 15, wherein the data output unit comprises:
a storage section configured to temporarily store the output signal of the comparison unit; and
a conversion section configured to convert a digital comparison signal outputted from the storage section into an analog comparison signal.

20. The multi-level memory apparatus of claim 19, wherein the storage section comprises an N-bit register, N being a positive integer.

21. The multi-level memory apparatus of claim 20, wherein the conversion section comprises an (N−1)-bit digital/analog converter.

22. The multi-level memory apparatus of claim 21, wherein the conversion section is configured to determine a level of the comparison current based on a change of the cell current, the change of the cell current depending on a value of data of the memory cell.

23. The multi-level memory apparatus of claim 21, wherein an output of the conversion section exponentially decreases and increases.

24. The multi-level memory apparatus of claim 21, wherein an output of the conversion section linearly decreases and increases.

25. The multi-level memory apparatus of claim 21, wherein the conversion section comprises:
a decoder configured to decode an output of the storage section; and
a plurality of unit current cells controlled by an output of the decoder and connected in parallel to each other.

26. A data sensing method of a multi-level memory apparatus, the method comprising:
selecting one of two or more current paths passing currents having different levels, and providing a cell current to a memory cell connected to the selected current path;
setting a comparison current for comparing the cell current with a predetermined value;

copying the cell current into a copied cell current having substantially the same level as that of the cell current when the cell current is larger than or equal to the predetermined value; and copying the cell current into a copied cell current having a level multiple times greater than that of the cell current by amplifying the cell current when the cell current is smaller than the predetermined value.

27. The data sensing method of claim 26, further comprising:

copying the comparison current, and outputting a copied comparison current;

comparing the copied cell current and the copied comparison current, and outputting a comparison signal; and temporarily storing the comparison signal, and outputting a digital comparison signal.

28. The data sensing method of claim 27, wherein the copied comparison current is determined based on a change of the cell current, the change of the cell current depending on a value of data of the memory cell.

29. A multi-level memory apparatus comprising:

two or more current paths configured to pass currents having different levels;

a memory cell selectively coupled to the two or more currents paths; and a coarse detection unit configured to copy a cell current flowing through the memory cell and detect whether or not the cell current exceeds a predetermined reference value.

30. The multi-level memory apparatus of claim 29, wherein the coarse detection unit is coupled to the two or more current paths in the form of a current mirror.

31. The multi-level memory apparatus of claim 29, wherein the two or more current paths comprise:

a first cell current copy driver configured to pass the cell current in a first range; and a second cell current copy driver configured to pass the cell current in a second range that is different from the first range.

32. The multi-level memory apparatus of claim 31, further comprising:

a charge selection unit configured to select one of the two or more current paths based on an output of the coarse detection unit, and charge a charge unit disposed on the selected current path based on the cell current passing through the selected current path;

a timing unit configured to output a code value changing at a predetermined time interval, using a plurality of current sources having different sizes;

a fine detection unit configured to store the code value outputted from the timing unit and output the code value in response to an output of the charge selection unit; and a cell current output unit configured to combine the output of the coarse detection unit and an output of the fine detection unit, and output a digital value corresponding to the cell current.

33. The multi-level memory apparatus of claim 32, wherein the coarse detection unit comprises one or more reference values.

34. The multi-level memory apparatus of claim 32, wherein the coarse detection unit, the first cell current copy driver, and the second cell current copy driver comprise offset current sources having the same size and are configured to generate offset currents.

35. The multi-level memory apparatus of claim 32, wherein the timing unit comprises:

a current supply section comprising the plurality of current sources configured to simultaneously and independently supply currents having two or more different levels;

a charge time detection section configured to convert the currents outputted from the plurality of current sources into different times; and an encoder configured to encode an output of the charge time detection unit and output the code value.

36. The multi-level memory apparatus of claim 35, wherein the fine detection unit comprises:

a cell current level detection section configured to output a cell current level detection signal transitioning when a voltage stored in the charge unit reaches a predetermined level; and a fine detection value management section configured to store the code value outputted from the timing unit and output the code value when a state of the cell current level detection signal transitions.

37. The multi-level memory apparatus of claim 36, wherein the charge time detection section comprises:

a plurality of chargers configured to be independently charged by the currents outputted from the plurality of current sources; and a charge level detector configured to output a state transition signal having a state that transitions when voltages stored in the plurality of chargers reach a predetermined level.

38. The multi-level memory apparatus of claim 37, wherein the cell current level detection signal of the cell current level detection section and the state transition signal of the charge level detector transition to substantially the same level.

* * * * *